United States Patent
Taniguchi et al.

(10) Patent No.: US 6,768,205 B2
(45) Date of Patent: Jul. 27, 2004

(54) THIN-FILM CIRCUIT SUBSTRATE (75) Inventors: Osamu Taniguchi, Kawasaki (JP); Tomoko Miyashita, Kawasaki (JP); Yasuo Yamagishi, Kawasaki (JP); Koji Omote, Kawasaki (JP); Yoshihiko Imanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/084,923

(22) Filed: Mar. 1, 2002

(65) Prior Publication Data

US 2003/0045085 A1 Mar. 6, 2003

(30) Foreign Application Priority Data

Aug. 30, 2001 (JP) ........................................ 2001-262359

(51) Int. Cl.[7] .................... H01L 27/13; H01L 23/48; H01L 23/52
(52) U.S. Cl. .................... 257/774; 257/668; 257/700; 257/701; 257/773; 257/698; 257/730
(58) Field of Search ........................ 257/774, 668, 257/758, 700, 701, 773, 698, 730, 680

(56) References Cited

U.S. PATENT DOCUMENTS 5,882,496 A * 3/1999 Northrup et al. ............ 204/601
6,002,515 A * 12/1999 Mizuuchi et al. ............ 359/326
2002/0109231 A1 * 8/2002 Chu et al. .................... 257/758

FOREIGN PATENT DOCUMENTS

JP          3-292762         * 12/1991

* cited by examiner

Primary Examiner—Alexander Oscar Williams
(74) Attorney, Agent, or Firm—Armstrong, Kratz, Quintos, Hanson & Brooks, LLP (57) ABSTRACT

The objective of the present invention is to provide a reliable thin-film circuit substrate or via formed substrate that is provided with minute via plugs at a fine pitch. The objective is served by forming an insulation layer that functions as an etching stopper on a Si substrate, and then via holes are formed in the Si substrate, using a semiconductor process, until the etching stopper layer is exposed. Further, a thin-film circuit is formed on the insulation layer, and the insulation layer is removed at the via holes such that the thin-film circuit is exposed. As necessary, the thin film circuit is heat-treated, and then the via holes are filled with an electrically conductive material and vamp electrodes are formed.

4 Claims, 10 Drawing Sheets

THIN-FILM CIRCUIT SUBSTRATE

BACKGROUND OF THE INVENTION

1. Field of the Invention

The present invention generally relates to an electronic device, and especially relates to a thin-film circuit substrate that has through holes, and a manufacturing method thereof and a via formed substrate that has through holes, and a manufacturing method thereof.

A so-called via formed substrate that has a large number of through holes formed is an important component for an interposer type part, a multilayer circuit board, and three-dimensional chip mounting technology.

Various circuit patterns are formed on the via formed substrate. In the interposer type component inserted between a wiring substrate and an LSI chip, a supply voltage fluctuation due to a high-speed operation of the LSI chip can be absorbed by forming a high dielectric capacitor or a ferroelectric capacitor on the substrate.

Further, by installing a via formed substrate such as above on a package substrate with other parts, a system package can be formed, and a multi chip module (MCM) and a system-in-package can be formed by arranging various parts, including an LSI chip, on the via formed substrate.

2. Description of the Related Art

Conventionally, via formed substrates using a ceramic substrate as a base have been marketed. In the via formed substrates available in the market, a number of through holes are formed on the ceramic substrate, each through hole being provided with a via plug of a low resistance metal, such as Cu and W.

Figure 1:
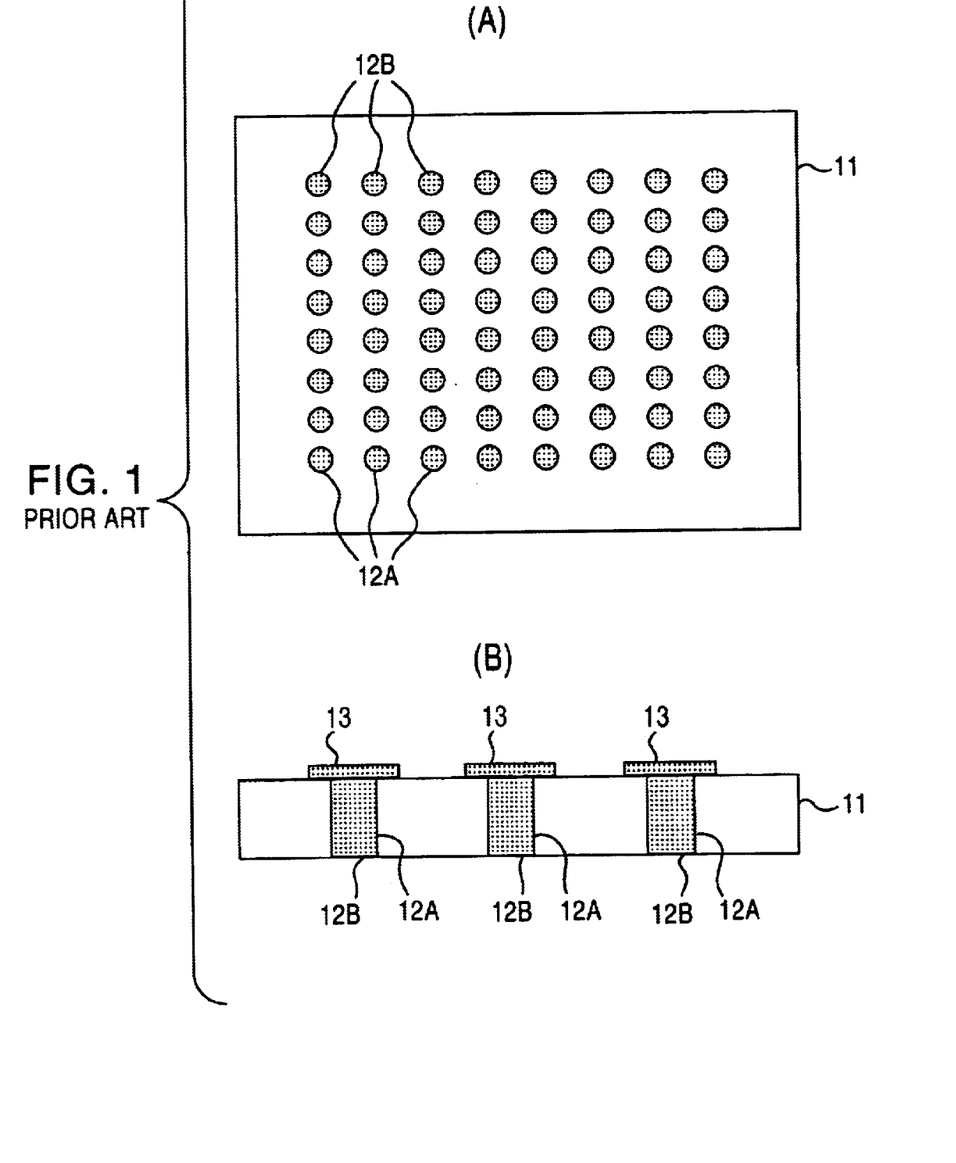
FIG. 1(A) and FIG. 1(B) are a plan and a sectional drawing, respectively, showing a conventional thin-film circuit substrate.

FIG. 1(A) and FIG. 1(B) show an example of a plan and a cross section, respectively, of a conventional via formed substrate.

With reference to the plan of FIG. 1(A), a number of via holes 12A are formed in a ceramic substrate 11 that is made of $Al_2O_3$ and the like, and each via hole 12A is filled with a via plug 12B that is made of a metal such as Cu and W.

The via formed substrate as shown in FIG. 1(A) and FIG. 1(B) is designed so that it is mainly inserted between a wiring substrate and electronic parts, and a number of electrode pads 13 which are made of nickel etc. are formed corresponding to each via plug 12B as shown in the cross section drawing of FIG. 1(B). By forming a solder vamp on each of the electrode pads 13, the via formed substrate electrically connects the wiring substrate on the bottom side and electronic parts on the top side.

Figure 2:
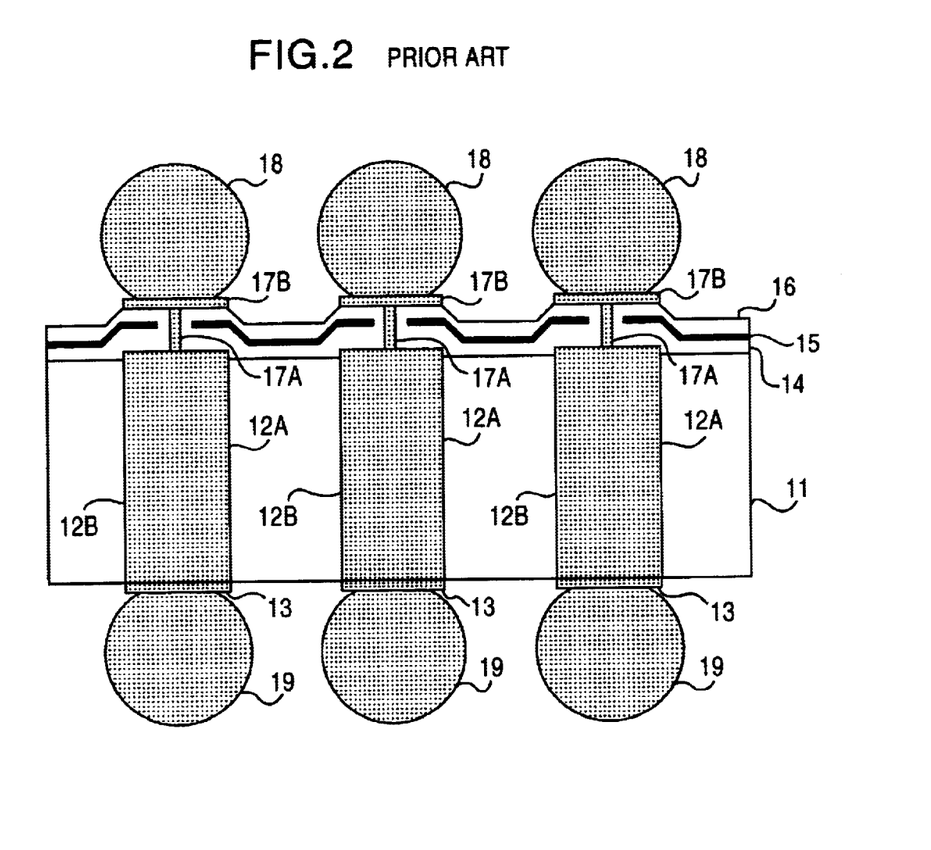
FIG. 2 is an expanded sectional view showing the thin-film circuit substrate of FIG. 1.

FIG. 2 shows an example of an interposer type thin-film circuit substrate of the related technology, in which a thin-film circuit including a ferroelectric capacitor is formed on the via formed substrate. In the interposer type thin-film circuit substrate in which this ferroelectric capacitor is formed, power supply wiring can be formed directly under an LSI chip in the shortest distance, and an impedance of the power supply wiring is minimized. Consequently, a power supply voltage fluctuation due to a high-speed operation of the LSI chip is suppressed by using the interposer type thin-film circuit substrate.

With reference toy FIG. 2, the electrode pads 13 of the upper surface of the via formed substrate 11 of FIG. 1(B) are removed by polish processing, and a capacitor insulator layer 14 of a material such as a ferroelectric material and a high dielectric material, such as BST and PZT, is formed on the upper surface of the via formed substrate 11. On the capacitor insulator layer 14, a metal layer 15 that functions as a grounding electrode is formed, and a polyimide protective coat 16 is further formed on the metal layer 15.

Contact holes penetrate the metal layer 15, the capacitor insulator layer 14 and the polyimide protective coat 16, exposing an edge of the via plugs 12B, and contact plugs 17A are formed, filling up the contact holes. Further, electrode pads 17B are formed on the polyimide protective coat 16, contacting a tip of the contact plugs 17A.

Vamp electrodes 18, such as solder balls, are formed on the electrode pads 17B. On the undersurface of the via formed substrate 11, vamp electrodes 19, such as solder balls, are formed under the electrode pads 13.

As regards parts including a capacitor insulator layer of a material such as a ferroelectric material and high dielectric material, heat treatment in an oxidization atmosphere at a temperature of at least 700 degrees C. is necessary. Since the via plugs 12B in the via holes 12A are made of a metal such as Cu and W which are easy to oxidize, the via plugs 12B expand as a result of oxidization, causing destruction of the thin film circuit formed on the surface of the ceramic substrate 11. In addition, control of contraction accompanying sintering when producing ceramic substrates is difficult, making it difficult to mount an LSI with large integration density on a via substrate using the ceramic substrate.

On the other hand, it is conceivable that an Si substrate is used as a via formed substrate, and minute via holes are arranged in a fine pitch on the Si substrate by a semiconductor process. Especially, by using a dry etching process, it is possible to form a large number of minute via holes simultaneously, having an extraordinarily large aspect ratio, in a fine pitch into the Si substrate.

In the dry etching process, however, an etching rate generally tends to vary, causing via holes to form with different depths when forming a large number of deep via holes, the variance being around ±5%. Consequently, when the dry etching process for a predetermined period is finished, some via holes may not have completely penetrated the Si substrate.

In this concern, when forming deep via holes in an Si substrate by dry etching, it is necessary to polish the back surface of the substrate after the dry etching process such that all the via holes surely have opening. Moreover, a needle-like structure is easy to be formed in a via hole bottom when forming a deep via hole in an Si substrate by dry etching. It is, therefore, considered indispensable to polish the back surface of the substrate as described above. The polishing process increases production costs of a via formed substrate.

Further, in the case of the via formed substrate based on the Si substrate, further polishing process is necessary in order to remove a surplus metal layer after filling up the via holes with a low resistance metal, such as Cu and W, and the polishing of the substrate surface has to be to a mirror finish so that a thin film circuit can be formed. Such mirror polishing further increases the production cost of the via formed substrate. Moreover, a process for forming an insulator layer on the mirror-polished surface of the via formed substrate is necessary prior to forming a thin-film circuit.

Further, in the via formed substrate based on the Si substrate, which is formed in this manner, when a thin-film circuit including a capacitor, such as a ferroelectric capacitor and a high dielectric capacitor, is formed on a via formed substrate, the via plugs in the via holes oxidize through the heat treatment in an oxidization atmosphere, causing the destruction or damage of the thin-film circuit, similar to the case of the via formed substrate of the conventional ceramic substrate. Moreover, the heat treatment for forming the thin-film circuit including the ferroelectric or the high dielectric capacitor can cause the via plugs to shrink.

Accordingly, it is desired that a thin-film circuit substrate, solving the problems as above be offered, which is based on the via formed substrate in which the via holes are formed in the Si substrate.

With an advancement in the integration density of LSI, and an enhancement of functions, need for decreasing the pitch of via holes in a substrate for mounting LSI, such as an MCM substrate using a via formed substrate, is rising.

Since via holes have been formed by machining, there is a limit to reduction in the pitch of the via formed substrate of the conventional technology, such as a ceramic substrate and a resin substrate. The limit can be eliminated by using an Si substrate as a via formed substrate, and by forming the via holes through a semiconductor process, as previously explained.

When a via substrate that has highly minute via holes is realized, a new problem arises. That is, when parts, such as LSI, are mounted on the solder balls on the via substrate, a large amount of stress is likely applied to the minute solder balls at the time of mounting the parts and in subsequent use of an electronic system, causing problems, such as breakage of a junction. Another problem to solve is that when forming the via holes in the Si substrate by a semiconductor process, such as dry etching, prolonged etching will be needed, and the production costs of a via formed substrate will increase.

SUMMARY OF THE INVENTION

Accordingly, it is a general object of the present invention to provide a novel and useful thin-film circuit substrate and a production method thereof, and an electronic system employing the thin-film circuit substrate.

It is another and more specific object of the present invention to provide a thin-film circuit substrate and a production method thereof that simplifies a production process to obtain a via formed substrate using a semiconductor base plate with an enhanced reliability.

Another object of the present invention is to provide a via formed substrate using a semiconductor substrate, wherein stress applied to vamp electrodes is minimized, and a manufacturing method thereof, which enables an efficient manufacturing thereof even when the diameter of via holes and the pitch of the via holes are decreased.

Other objects and further features of the present invention will become apparent from the following detailed description when read in conjunction with the accompanying drawings.

The present invention solves the above problems by providing a thin-film circuit substrate and a manufacturing method thereof, as follows. The thin-film circuit substrate includes a semiconductor substrate that has a first principal plane and a second principal plane that counters the first principal plane, a first insulation film formed on the first principal plane, and through holes that extend continuously from the second principal plane to the first principal plane, completely through the semiconductor substrate, the through holes including a main section starting from the second principal plane and a tapered section formed near the first principal plane. The manufacturing method includes a step of forming an etching stop film on the first principal plane of the semiconductor substrate that is formed by the first and the second principal planes, a step of forming a resist pattern which has resist openings on the second principal plane of the semiconductor substrate, a step of dry etching the semiconductor substrate using the resist pattern as a mask such that through holes are provided corresponding to the resist openings to the semiconductor substrate and such that the etching stop film is exposed at the through holes, a step of forming an insulator film on the side wall face of the through holes, and a step of removing the etching stop film at the through holes such that openings are formed, exposing the thin-film circuit.

According to the present invention, a thin-film circuit is formed before formation of via plugs on the semiconductor substrate surface that is mirror-finished beforehand, dispensing with a mirror polish process after the formation of the via plugs, which was needed conventionally, and simplifying the manufacturing process of the thin-film circuit substrate. That is, according to the present invention, the thin-film circuit is formed before the via plug formation process. Therefore, oxidization and inflation/contraction of the via plugs, which are due to a heat treatment in an oxidization atmosphere for making a ferroelectric film and a high dielectric film, are avoided, contributing to a high manufacturing yield of a thin-film circuit substrate. Further, by using semiconductor substrates, such as Si substrates, and forming through holes by a dry etching process, a via diameter can easily be made minute, and a fine via pitch can be obtained.

The present invention employs an over-etching for making the through holes by the dry etching method such that all the through holes of the substrate surely penetrate. Here, the over-etching has a tendency to cause the bottom part of the through holes to expand sideways. In order to suppress the sideways expansion of the through holes, the present invention provides an oxide film such that the through holes are surrounded on the substrate bottom. With this structure, when the dry etching process for forming the through holes is stopped by the etching stop film at the bottom of the substrate, advance of the dry etching process to the side is prevented by the oxide film. In this manner, expansion of the through hole bottoms is suppressed, enabling the formation of minute through holes repeatedly at a fine pitch.

Further, the present invention solves the above problems by providing a via formed substrate, and a forming method thereof, as follows. The via formed substrate includes a supporting substrate having a first principal plane and a second principal plane that counters the first principal plane, through holes in a first diameter extending from the second principal plane toward the first principal plane of the supporting substrate, tapered sections formed to the through holes at an end section toward the first principal plane with openings of a second diameter that is larger than the first diameter at the first principal plane, conductive plugs that fill up the through holes, and electrode pads that are formed on the tapered sections and are electrically connected to the conductive plugs in a tapered shape corresponding to the tapered sections. The forming method of the via formed substrate described above includes a step of forming tapered concavities on the first principal plane of the semiconductor substrate by anisotropic etching, a step of forming an insulation layer in a shape corresponding to the tapered concavities and covering the surface of the tapered concavities, a step of forming the via holes that extend from the second principal plane that counters the first principal plane to the first principal plane such that the via holes expose the insulation layer at the tapered concavity section, a step of forming the electrode pads on the insulation layer in a shape corresponding to the top shape of the tapered section such that the tapered sections are surrounded, and a step of forming the via plugs by filling up the via holes with conductive materials.

According to the present invention, by forming the tapered section at the via hole end of the via substrate, a minute via hole can accommodate a solder ball, or a vamp electrode, of a relatively large diameter. Consequently, when parts, such as an LSI chip, are mounted on this via substrate, stress applied to the vamp electrode is eased. The present invention is particularly effective for forming highly minute via holes at a very fine pitch to a via formed semiconductor substrate, such as a Si substrate. The tapered section in the semiconductor substrate surface can be formed beforehand by anisotropic etching, such as wet etching. By preparing the tapered section beforehand, the dry etching process for forming through holes can be shortened, and the manufacturing efficiency of the via formed substrates can be raised.

DESCRIPTION OF THE PREFERRED EMBODIMENTS

In the following, embodiments of the present invention will be described with reference to the accompanying drawings.

FIG. 3(A), FIG. 3(B), FIG. 3(C), FIG. 3(D) and FIG. 3(E) show the first embodiment of the present invention of a manufacturing process of a thin-film circuit substrate 20.

Figure 3:
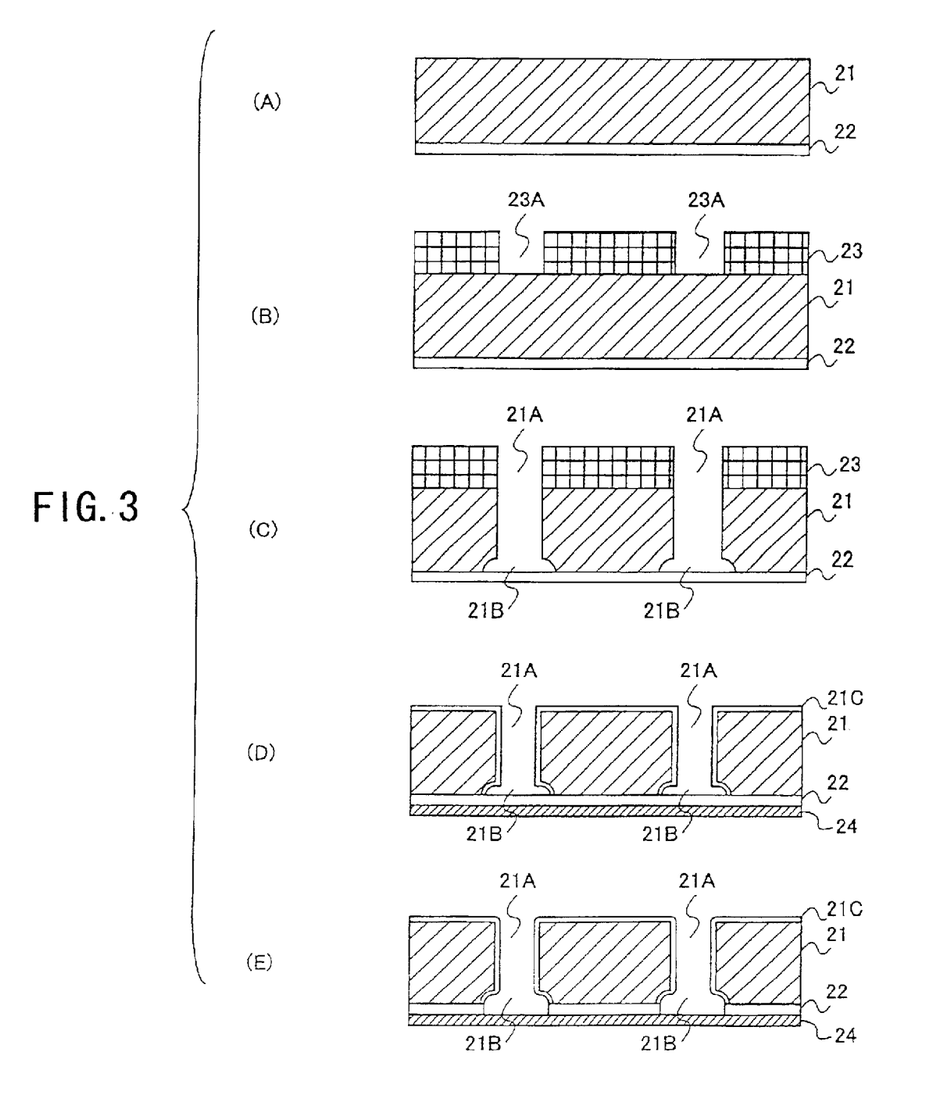
FIG. 3(A), FIG. 3(B), FIG. 3(C), FIG. 3(D), and FIG. 3(E) are figures showing a manufacturing process of the thin-film circuit substrate of the first embodiment of the present invention.

With reference to FIG. 3(A), an etching stop film 22 of the thickness of about 2 micrometers made of an $SiO_2$ film is formed by a CVD process on a bottom principal plane of a single crystal Si substrate 21 whose thickness is between 300 and 600 micrometers.

Next, in a process of FIG. 3(B), a resist pattern 23 is formed on a top principal plane of the Si substrate 21, to which resist openings 23A of dozens of micrometers in diameter are formed, and in the process of FIG. 3(C), dry etching is performed for about 180 minutes by supplying etching gases of $C_4F_8$ and $SF_6$ alternately to an exposed section of the Si substrate 21 in an ICP plasma etching system, using the resist pattern 23 as a mask such that through holes 21A that extend from the top principal plane to the bottom principal plane through the Si substrate 21 are formed. The dry etching for forming the through holes 21A stops, when the etching stop film 22 is exposed in the through holes 21A.

At the process of FIG. 3(C), a large number of through holes 21A are formed simultaneously. In view of variation in an etching rate among the through holes, the etching is performed for a slightly prolonged period, that is, over-etching is performed so that all through holes 21A penetrate from the top principal plane to the bottom principal plane. Although a large portion of a through holes 21A is formed with a perpendicular wall surface, as a result of this over-etching, the diameter of the through holes 21A at the bottom that touches the etching stop film 22 is expanded by about 10 micrometers for a depth range of about 10 micrometers, and an over-etched section 21B is formed. As shown in FIG. 3(C), in the over-etched section 21B, the etching stop film 22 is exposed.

Next, the resist pattern 23 is removed at the process of FIG. 3(D), and further, an oxide-film 21C is formed on the wall surface of the through holes 21A, including the over-etched section 21B, by performing one of a thermal oxidation process at a temperature between 800 and 1050 degrees C., and a CVD process. Moreover, at the process of FIG. 3(D), the thin-film circuit 24 is formed on the etching stop film 22. The thin-film circuit 24 may include a capacitor such as a ferroelectric capacitor and a high dielectric capacitor as previously shown in FIG. 2. Alternatively, the thin-film circuit 24 may have a multilayer structure. When the thin-film circuit 24 includes a capacitor such as a ferroelectric capacitor and a high dielectric capacitor, in the process of FIG. 3(D), a heat treatment at a temperature between 600 and 800 degrees C. in oxidization atmosphere is performed, and oxygen deficit compensation processing is performed to the formed capacitor such as a ferroelectric capacitor and a dielectric capacitor.

Next, in the process of FIG. 3(E), the dry etching stop film 22 is removed by dry etching through the through holes 21A, and an opening corresponding to each through hole 21A is formed in the etching stop film 22. The thin-film circuit 24 is exposed in this opening.

With regard to the structure of FIG. 3(E), the etching stop film 22 extends from the bottom end of the through holes 21A corresponding to the bottom principal plane of the Si substrate 21 toward the center of the through holes in a distance corresponding to the thickness of the side wall oxide-film 21C. The edge of the side wall oxide-film 21C touches the upper surface of the etching stop film 22.

When both the side wall oxide-film 21C and the etching stop film 22 are oxide films, selective etching between the films 21C and 22 is not practically available in the dry etching of FIG. 3(E). In this case, it is desirable to set the thickness of the side wall oxide-film 21C thicker than the thickness of the etching stop film 22 to ensure that only the etching stop film 22 is removed.

Figure 4:
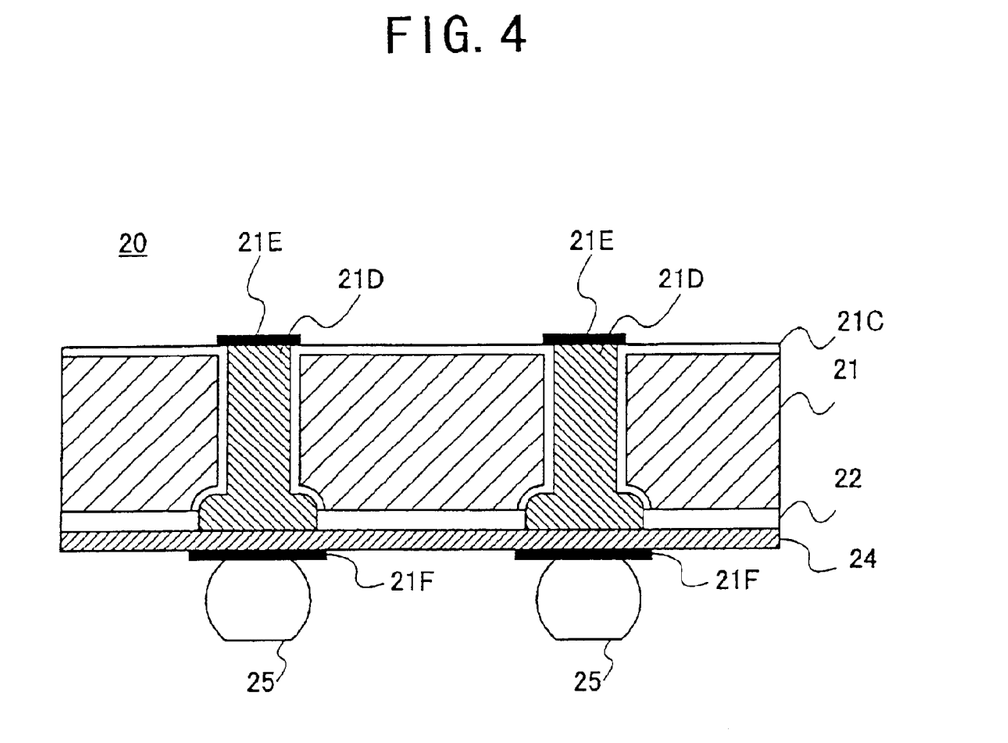
FIG. 4 is a sectional drawing showing a structure of the thin-film circuit substrate of the first embodiment of the present invention.

FIG. 4 shows a structure of the thin-film circuit substrate 20 formed as above, wherein via plugs are formed, and solder vamps are further formed.

With reference to FIG. 4, via plugs 21D made of a low resistance metal, such as Cu and W, are formed in the through holes 21A, filling up the through holes 21A, and electrode pads 21E made of Pt or Au are formed at the upper edge of the via plugs 21D.

On the bottom side, corresponding to the via plugs 21D, electrode pads 21F are formed on the thin film circuit 24, and vamp electrodes of a solder ball 25 are formed on the electrode pads 21F.

In the thin-film circuit substrate 20 with the structure of FIG. 4, the thin-film circuit 24 is formed before forming the via plugs 21D. A heat treatment in a high temperature oxidization atmosphere is not necessary after forming the via plugs 21D. In this manner, the problem of destruction of the thin film circuit 24 due to an expansion of the via plugs 21D by oxidization does not arise.

As above, in the thin-film circuit substrate 20 structured as shown in FIG. 4, a process for removing existing electrode pads by polishing, which is required in the case that a ceramic substrate of FIG. 1(A) and FIG. 1(B) is used, is made unnecessary by using Si substrate. Further, it is possible to form through holes 21A, therefore via plugs 21D, of a highly minute diameter with a very fine repetition pitch.

FIG. 5(A), FIG. 5(B), FIG. 5(C), FIG. 6(D), FIG. 6(E), and FIG. 6(F) show a manufacturing method of a thin-film circuit substrate 20A by the second embodiment of the present invention. Here, regarding a portion explained previously, the same reference numbers are given in the figures and an explanation is omitted.

Figure 5:
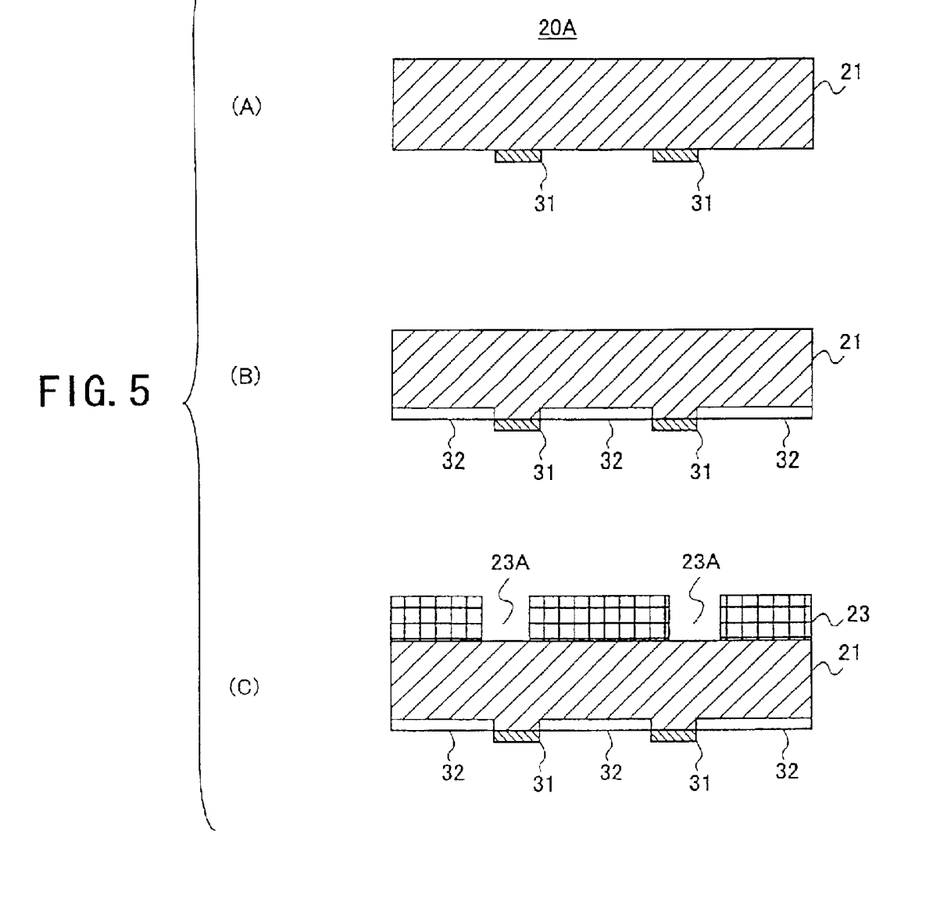
FIG. 5(A), FIG. 5(B) and FIG. 5(C) are figures showing a first part of a manufacturing process of the thin-film circuit substrate of the second embodiment of the present invention.

With reference to FIG. 5(A), a SiN pattern 31 that will become an etching stop film is formed on the bottom principal plane of the Si substrate 21 corresponding to via holes to be formed. In the process of FIG. 5(B), a thermal oxidation processing is performed on the Si substrate 21 of FIG. 5(A). Consequently, as shown in FIG. 5(B), a thermal oxidation film 32 is formed in a self-alignment manner on the both sides of the SiN pattern 31 of the bottom principal plane of the Si substrate 21.

Figure 6:
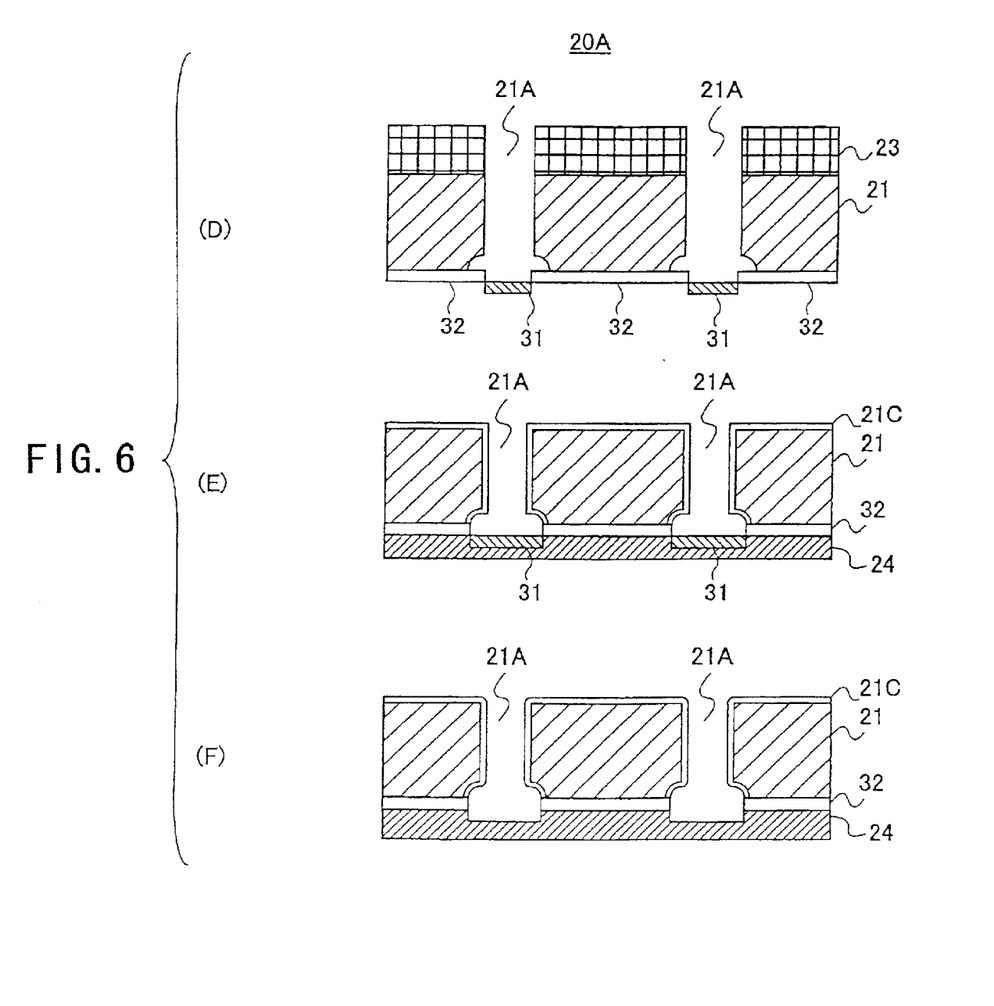
FIG. 6(D), FIG. 6(E), and FIG. 6(F) are figures showing a second part of the manufacturing process of the thin-film circuit substrate of the second embodiment of the present invention.

Next, in the process of FIG. 5(C), a resist film 23 which has resist opening 23A corresponding to the via holes to be formed on the top principal plane of the Si substrate 21 is formed like the process of FIG. 3(B). In the process of FIG. 6(D), dry etching of the Si substrate 21 is carried out until the SiN etching stop pattern 31 is exposed, using the resist film 23 as a mask such that the through hole 21A is formed in the Si substrate 21 corresponding to the resist opening 23A. In the above dry etching process for forming the through holes 21A, etching time is extended such that the so-called over-etching is performed in order that the SiN etching stop pattern 31 is surely exposed in all the through holes 21A of the Si substrate 21, similarly to the previous embodiment.

Further, the resist film 23 is removed in the process of FIG. 6(E), and an insulator layer 21C is formed by a thermal oxidation process or a CVD process on the inner wall surface of the through holes 21A formed by the process of FIG. 6(D). Moreover, in the process of FIG. 6(E), the thin-film circuit 24 is formed on the thermal oxidation film 32 on the bottom principal plane of the Si substrate 21. The thin-film circuit 24 may include a ferroelectric film or a high dielectric film, as explained previously, and in that case, a heat treatment in an oxidization atmosphere is performed for crystallization and oxygen deficit compensation.

Further, in the process of FIG. 6(F), the SiN etching pattern 31 is removed by a selective etching process, and the thin-film circuit is exposed.

After the process of FIG. 6(F), the thin-film circuit substrate 20A that is almost the same as FIG. 4 is obtained by filling the via holes 21A with a metal such as Cu and W.

In this embodiment, the thermal oxidation film 32 is formed, in the self-alignment manner, on the both sides of the SiN etching stop pattern 31 on the bottom principal plane of the Si substrate 21 in the process of FIG. 5(B). For this reason, there is an advantage in that the insulation layer of the side wall is secured, and opening is surely achieved by the selective etching of FIG. 6(F).

Figure 7:
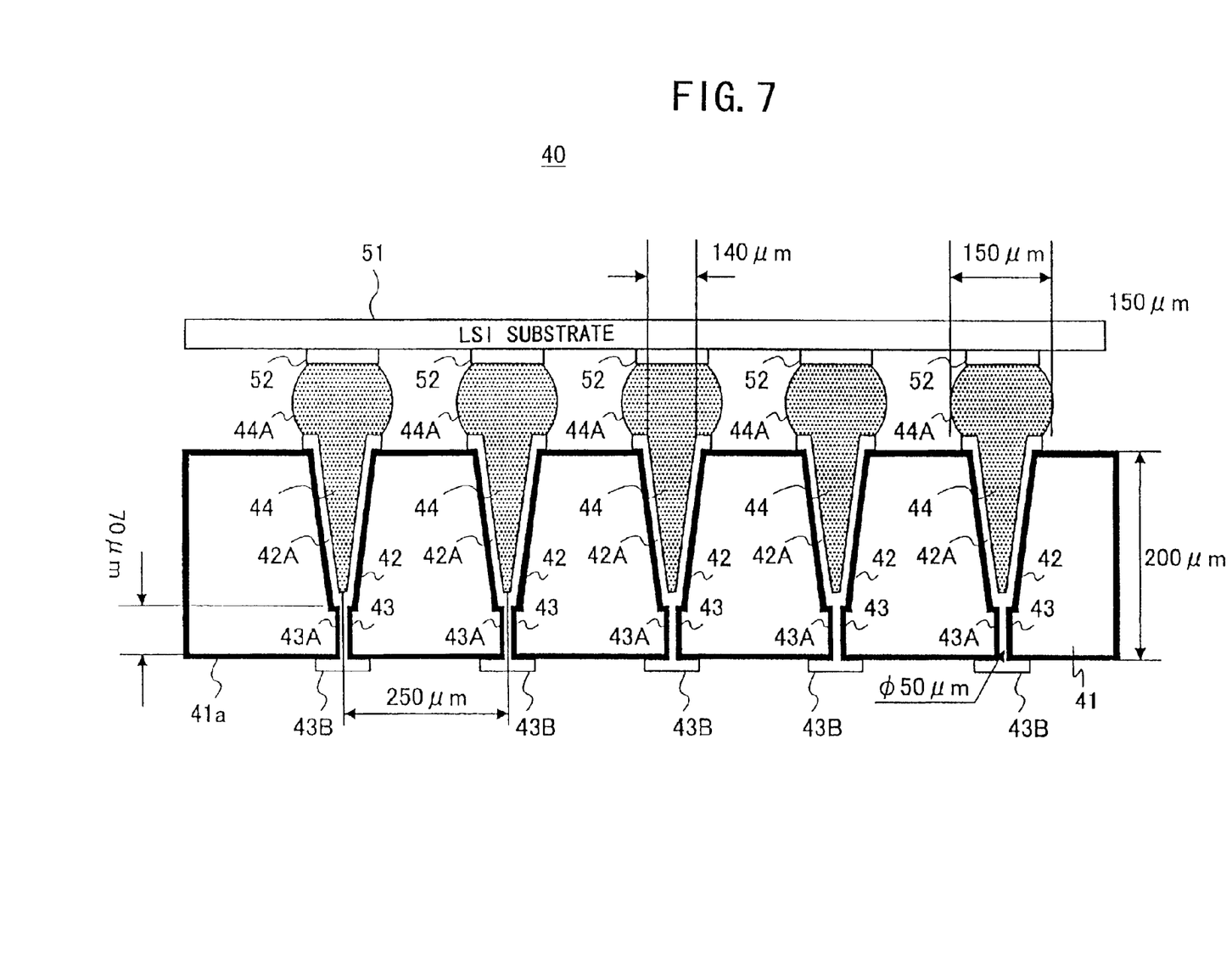
FIG. 7 is a figure showing a structure of the via formed substrate of the third embodiment of the present invention.

FIG. 7 shows a structure of a via formed substrate 40 by the third embodiment of the present invention.

With reference to FIG. 7, the via formed substrate 40 is structured by a Si substrate 41 whose thickness is hundreds of micrometers, and includes the Si substrate 41, two or more concavities 42 formed in the upper principal plane of the Si substrate 41, and through holes 43 that are formed corresponding to respective concavities, and penetrate the inside of the Si substrate 41 from the bottom of each concavity to the bottom principal plane of the Si substrate 41. Both principal planes of the Si substrate 41, surfaces of the concavities, surfaces of walls of the through holes, and the both edges of the Si substrate 41 are preferably covered by an insulator layer 41a of a thermal oxidation film.

The concavities 42 are preferably formed by a crystal face of Si, and electrode pads 42A of Pt and the like are formed corresponding to a shape of the concavities 42. Via plugs 43A of Pt fill the through holes 43. On the bottom principal plane of the Si substrate 41, electrode pads 43B of Pt and the like are formed corresponding to each of the via plugs 43A.

In FIG. 7, the through holes 43 have a depth of 70 micrometers, and are repeatedly formed in a 250-micrometer pitch in the Si substrate 41. The concavities 42 are formed on the face of Si substrate 41, and form opening whose diameter is about 140 micrometers as measured at the upper principal plane of the Si substrate 41.

Each of the through holes 43 with a corresponding concavity 42 forms a via hole which continuously extends from the top principal plane to the bottom principal plane through the Si substrate 41.

Solder plugs 44 that contact with electrode pads 42A fill each of the concavities 42, and solder balls 44A whose diameter is about 150 micrometers are formed on the tip of the solder plugs 44.

The structure as shown in FIG. 7 includes an LSI substrate 51 that has electrode pads 52, which is mounted on the via substrate, and each of the electrode pads 52 contacts a corresponding solder ball 44A.

According to this structure, a relatively large diameter of the solder balls 44A can be provided, corresponding to the concavities 42, even if the pitch of the through holes 43, therefore the pitch of the via holes, is made highly minute, by forming the concavities 42 in the surface of the Si substrate 41. By using the large solder balls 44A, stress applied to the solder balls 44A and the solder plugs 44 becomes small, even when an external force is applied to the LSI substrate 51 (and the electrode pads 52), avoiding problems, such as breakage of the contact section. Moreover, the thermal stress produced when mounting the LSI substrate 51 is also mitigated by forming the concavities 42 in this manner.

Although it is also possible to use other substrates instead of the Si substrate 41 in the present invention, since the concavities 42 can be accurately formed by anisotropic etching, such as wet etching, it is desirable to use semiconductor substrates including the Si substrate as the substrate 41.

Numeric values shown in FIG. 7 are examples, and do not limit the present invention. Further in reference to FIG. 7, it is also possible to mount an LSI chip instead of the LSI substrate.

Next, a manufacturing process of the via formed substrate of FIG. 7 will be described, referring to FIG. 8(A), FIG. 8(B), FIG. 8(C), FIG. 8(D), FIG. 8(E), FIG. 8(F), FIG. 8(G), FIG. 9(H), FIG. 9(I), FIG. 9(J), FIG. 9(K), FIG. 9(L), and FIG. 9(M).

Figure 8:
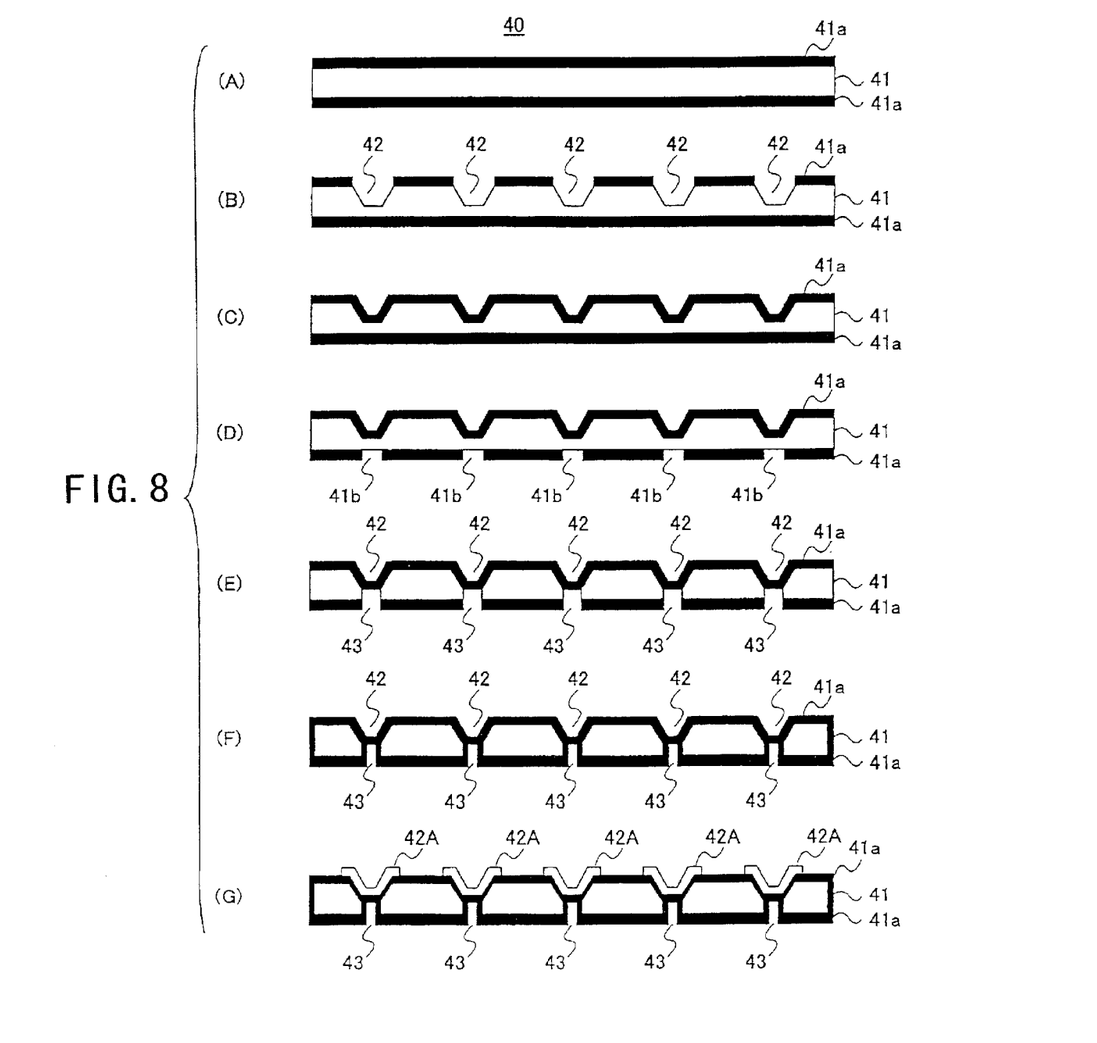
FIG. 8(A), FIG. 8(B), FIG. 8(C), FIG. 8(D), FIG. 8(E), FIG. 8(F), and FIG. 8(G) are figures showing a first part of a manufacturing process of the via formed substrate of FIG. 7.

With reference to FIG. 8(A), an oxide-film 41$a$ is formed in the face of the Si substrate 41 by a thermal oxidation process.

Next, in the process of FIG. 8(B), photo-lithography patterning is applied to the oxide-film 41$a$ on the upper principal plane of the Si substrate 41, forming openings. At the formed openings, concavities 42 are repeatedly formed on the face of Si on the upper principal plane of the Si substrate 41 by applying anisotropic etching, which is a wet etching method using KOH, to the Si substrate 41.

Next, in the process of FIG. 8(C), a thermal oxidation film 41$a$ is again formed on the surface of the concavities 42 formed at the process of FIG. 8(B). Further, in the process of FIG. 8(D), openings 41$b$ are formed on the oxide-film 41$a$ on the bottom principal plane of the Si substrate 41, so that the bottom principal plane of the Si substrate 41 is exposed corresponding to each of the concavities 42.

Next, in the process of FIG. 8(E), the Si substrate 41 of FIG. 8(D) is placed in a reaction chamber of an ICP type dry etching system (not shown), and a dry etching process is performed, using etching gases $C_4F_8$ and $SF_6$ such that openings 43 are formed corresponding to each of the openings 41$b$ that extends from the bottom principal plane toward an upper principal plane of the Si substrate 41. As shown in FIG. 8(E), the dry etching process stops, when the oxide-film 41$a$ which covers the bottom of the concavities 42 is exposed.

Next, in the process of FIG. 8(F), a thermal oxidation process is performed to the structure of FIG. 8(E), and a thermal oxidation film 41$a$ is formed in the side wall face of the opening 43.

Further, in the process of FIG. 8(G), an electric conductive film, such as a Pt film, accumulates on the structure of FIG. 8(F), and electrode pads 42A are formed on the concavities 42 by patterning the electric conductive film.

Figure 9:
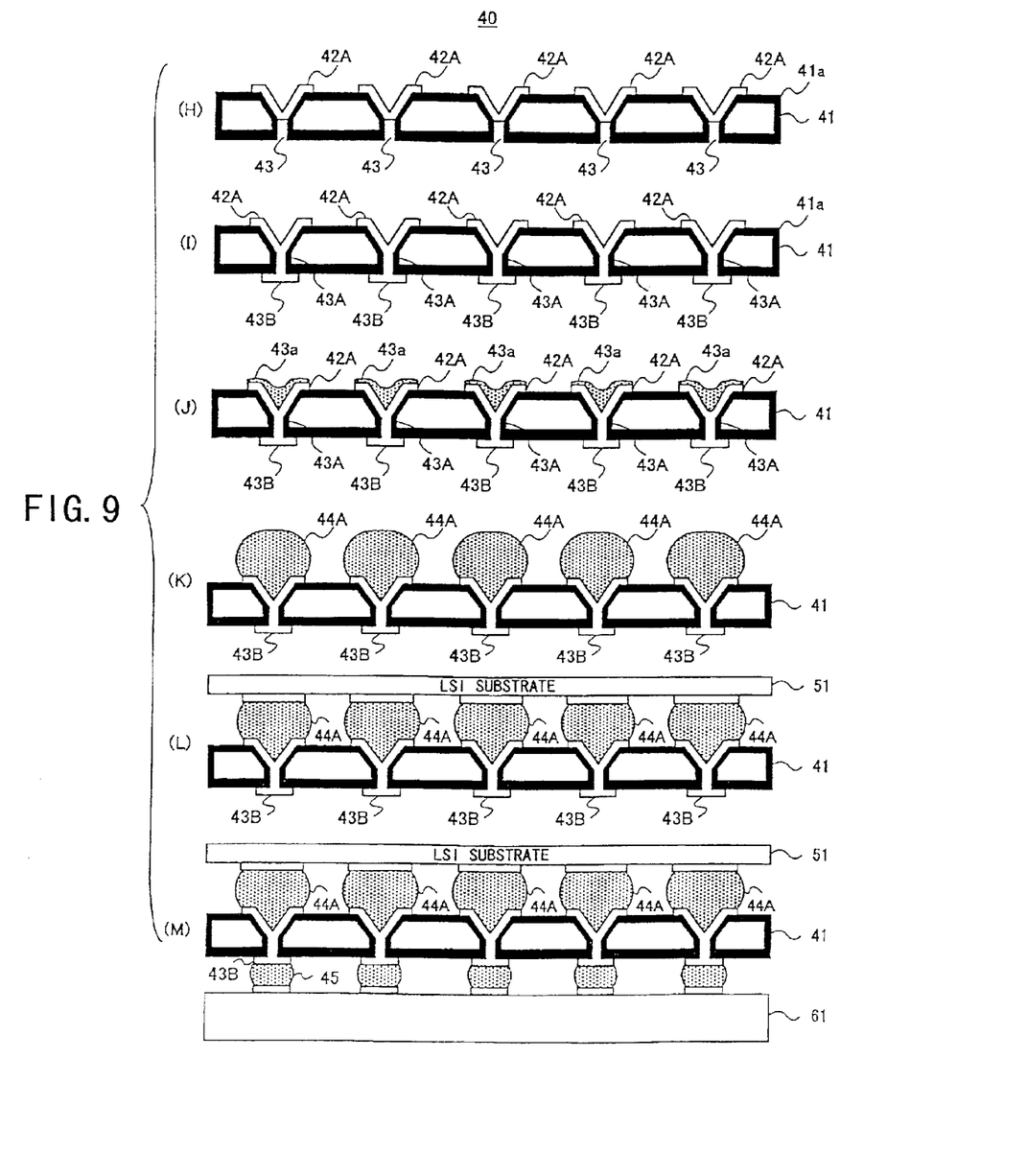
FIG. 9(H), FIG. 9(I), FIG. 9(J), FIG. 9(K), FIG. 9(L), and FIG. 9(M) are figures showing a second part of the manufacturing process of the via formed substrate of FIG. 7.

Next, in the process of FIG. 9 (H), the thermal oxidation film 41$a$ that intervenes between the electrode pads 42A and the openings 43 in the structure of FIG. 8(F) is removed by a dry etching process, and the electrode pads 42A are exposed in the upper end of the openings 43. That is, in the stage of FIG. 9 (H), the openings 43 serve as through holes that extend through the inside of the Si substrate 41.

Next, in the process of FIG. 9 (I), a via plug 43A is formed in each of the through holes 43 by a process, such as electrolytic plating, and electrode pads 43B Pt and the like corresponding to the via plugs 43A are further formed on the bottom surface of the Si substrate 41.

Next, in the process of FIG. 9 (J), an Sn—Ag type soldering paste 43$a$ is applied by a lift-off method and the like on each of the electrode pads 42A, and a heat treatment is applied at 260 degrees C. such that the solder reflows, and the via formed substrate is formed.

Further, in the process of FIG. 9 (K), solder balls 44A whose diameter is 150–180 micrometers are imprinted on the soldering paste 43$a$. In the process of FIG. 9 (L), the LSI substrate 51 is mounted through the solder balls 44A on the via formed substrate of FIG. 9 (J).

Further, in the process of FIG. 9 (M), an electronic system is formed by mounting the via formed substrate of FIG. 9 (L) on a wiring substrate 61 through the electrode pads 43B and the solder vamps 45.

In this embodiment, the solder balls of a large diameter are used by forming the concavities 42 on the surface of the via formed substrate. This structure distributes a stress due to an external force applied to the LSI substrate 51 to the solder balls 44A, avoiding damage.

Moreover, in this embodiment, since the concavities 42 are formed in advance by an anisotropic etching process, such as a wet etching process, on the Si substrate, a desired shortening of time required for the dry etching process when forming the through holes 43A is achieved.

Figure 10:
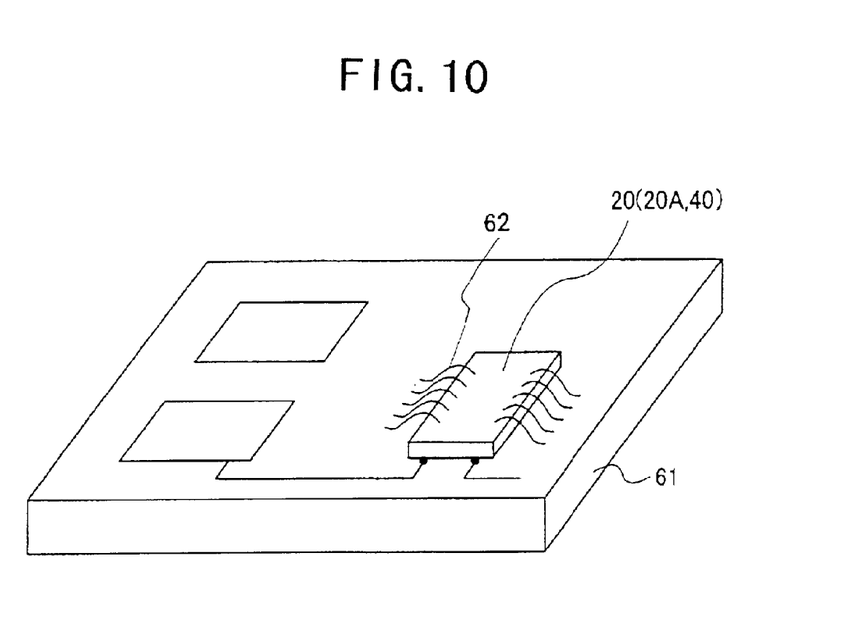
FIG. 10 is a figure showing an example of a system package structured by the thin-film circuit substrate or the via formed substrate of the present invention.

In addition to the interposer type substrate explained in FIG. 9 (M), the thin-film circuit substrates 20 and 20A and the via formed substrate 40 of the present invention can be mounted on a wiring substrate 61 through the vamp electrodes and wiring with lead wires 62, as shown in FIG. 10, such that a system package is produced.

Figure 11:
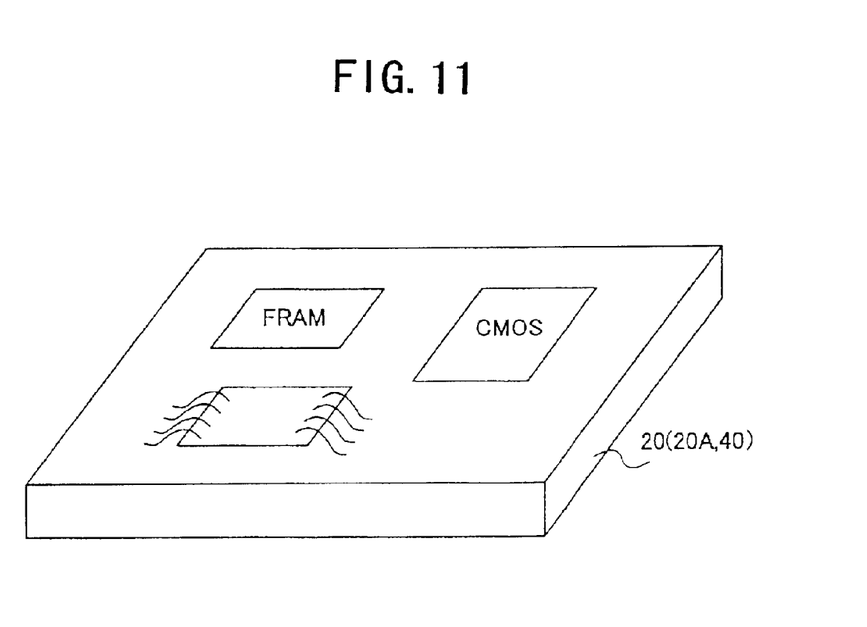
FIG. 11 is a figure showing an example of a system-in-package structured by the thin-film circuit substrate or the via formed substrate of the present invention.

Further, the thin-film-circuit substrates 20 and 20A and the via formed substrate 40 of the present invention can also form a system-in-package by equipping an integrated circuit, such as FRAM and CMOS, as shown in FIG. 11.

Further, the thin-film circuit substrates 20 and 20A and the via formed substrate 40 of the present invention can also provide the 3-dimensional integrated-circuit device by laminating the mounting structure of FIG. 9 (M).

Further, the present invention is not limited to these embodiments, but various variations and modifications may be made without departing from the scope of the present invention.

The present application is based on Japanese priority application No. 2001-262359 filed on Aug. 30, 2001, with the Japanese Patent Office, the entire contents of which are hereby incorporated by reference.

According to the present invention, a thin-film circuit is formed on a semiconductor substrate surface that is mirror finished in advance, dispensing with a mirror polishing process after formation of via plugs, which was needed conventionally, simplifying a manufacturing process of a thin-film circuit substrate. Moreover, according to the present invention, the thin film circuit is formed before the via plugs are formed, so that even if an oxidization heat treatment for forming an ferroelectric film and a high dielectric film is included in a process for forming the thin-film circuit, oxidization and expansion/contraction of the via plugs do not take place, improving the manufacturing yield of the thin-film circuit substrate. Further, by using the semiconductor substrate, such as an Si substrate, and forming through holes by a dry etching process, a diameter of the via holes can easily be made minute, and a fine via pitch can be obtained.

According to the present invention, by forming a taper form section in the via hole ends of the via substrate, forming solder balls and vamp electrodes with a comparatively large diameter is enabled, even if the through holes are minute in diameter. Consequently, when parts, such as an LSI chip, are mounted on the via substrate, stress applied to the vamp electrodes can be eased. This invention is particularly effective for a via substrate that includes highly minute via holes at a very fine pitch in a semiconductor substrate, such as an Si substrate. The taper form section can be formed beforehand in the semiconductor substrate surface by anisotropic etching, such as wet etching. Thus, when the taper form section is formed beforehand, time required for the dry etching process for forming through holes is shortened, and manufacturing efficiency of a via formed substrate can be raised.

What is claimed is:

1. A thin-film circuit substrate, comprising:

a semiconductor substrate having a first principal plane and an opposing second principal plane, a first insulator layer formed on the first principal plane of the semiconductor substrate, a plurality of through holes that continuously extends extend from the second principal plane to the first principal plane through the inside the semiconductor substrate, each including a main section substantially having a first diameter and extending from the second principal plane, and a tapered section having a second diameter that is larger than the first diameter near the first principal plane, a second insulator layer that covers a side wall face of the through holes, an electrically conductive material filled in the through holes, and a thin-film circuit layer formed on the first insulator layer, having a flat face which contacts the first insulator layer and the electrically conductive material in the through holes.

2. The thin-film circuit substrate as claimed in claim 1, wherein the first insulator layer comprises an opening formed by an inner wall surface of the second insulator layer of the through holes.

3. The thin-film circuit substrate as claimed in claim 2, wherein a concavity of a diameter larger than the opening on a side that touches the first insulator layer, corresponding to the through hole, is provided.

4. The thin-film circuit substrate as claimed in claim 1, further comprising a plurality of the electrode pads covering opening portions of the through holes on the second principal surface.

* * * * *